(12) United States Patent  
Smith et al.

(10) Patent No.: US 7,924,483 B2
(45) Date of Patent: Apr. 12, 2011

(54) FUSED MULTI-ARRAY COLOR IMAGE SENSOR

(76) Inventors: Scott T. Smith, Saratoga, CA (US); Dmitry Bakin, San Jose, CA (US)

( * ) Notice: Subject to any disclaimer, the term of this patent is extended or adjusted under 35 U.S.C. 154(b) by 1437 days.

(21) Appl. No.: 11/367,580

(22) Filed: Mar. 6, 2006

(65) Prior Publication Data

US 2007/0206241 A1    Sep. 6, 2007

(51) Int. Cl.
*H04N 1/04* (2006.01)
(52) U.S. Cl. ......... 358/514; 358/513; 358/482; 358/483
(58) Field of Classification Search .................. 358/514, 358/513, 482, 483
See application file for complete search history.

(56) References Cited

U.S. PATENT DOCUMENTS

| | | | |
|---|---|---|---|
| 6,667,818 B1 * | 12/2003 | Kuo | 358/514 |
| 2004/0085460 A1 * | 5/2004 | Shiomi | 348/231.3 |
| 2005/0134699 A1 | 6/2005 | Nagashima | |
| 2005/0134712 A1 | 6/2005 | Gruhlke | |
| 2005/0225654 A1 | 10/2005 | Feldman et al. | |
| 2007/0034777 A1 * | 2/2007 | Tuckerman et al. | 250/208.1 |
| 2007/0153106 A1 * | 7/2007 | Subbotin | 348/272 |

OTHER PUBLICATIONS

European Examination Report, Mar. 19, 2009.

* cited by examiner

*Primary Examiner* — Houshang Safaipour

(57) ABSTRACT

The invention, in various exemplary embodiments, incorporates multiple image sensor arrays, with separate respective color filters, on the same imager die. One exemplary embodiment is an image sensor comprising a plurality of arrays of pixel cells at a surface of a substrate, wherein each pixel cell comprises a photo-conversion device. The arrays are configured to commonly capture an image. An image processor circuit is connected to said plurality of arrays and configured to combine the captured images, captured by the plurality of arrays, and output a color image.

9 Claims, 11 Drawing Sheets

US 7,924,483 B2

FUSED MULTI-ARRAY COLOR IMAGE SENSOR

FIELD OF THE INVENTION

The present invention relates generally to the field of semiconductor devices and more particularly to multi-array image sensor devices.

BACKGROUND OF THE INVENTION

The semiconductor industry currently produces different types of semiconductor-based image sensors that use micro-lenses, such as charge coupled devices (CCDs), CMOS active pixel sensors (APS), photodiode arrays, charge injection devices and hybrid focal plane arrays, among others. These image sensors use micro-lenses to focus electromagnetic radiation onto photo-conversion devices, e.g., photodiodes. Also, these image sensors can use color filters to pass particular wavelengths of electromagnetic radiation for sensing by the photo-conversion devices, such that the photo-conversion devices typically are associated with a particular color.

Micro-lenses help increase optical efficiency and reduce crosstalk between pixel cells of an image sensor. FIGS. 1A and 1B show a top view and a simplified cross section of a portion of a conventional color image sensor using a Bayer color filter patterned array 100 (described below). The array 100 includes pixel cells 10, each being formed on a substrate 1. Each pixel cell 10 includes a photo-conversion device 12r, 12g, 12b, for example, a photodiode, and a charge collecting well 13r, 13g, 13b. The illustrated array 100 has micro-lenses 20 that collect and focus light on the photo-conversion devices 12r, 12g, 12b, which in turn convert the focused light into electrons that are stored in the respective charge collecting wells 13r, 13g, 13b.

The array 100 can also include or be covered by a color filter array 30. The color filter array 30 includes color filters 31r, 31g, 31b, each disposed over a pixel cell 10. Each of the filters 31r, 31g, 31b allows only particular wavelengths of light to pass through to a respective photo-conversion device. Typically, the color filter array is arranged in a repeating Bayer pattern that includes two green color filters 31g for every red color filter 31r and blue color filter 31b, arranged as shown in FIG. 1A.

Between the color filter array 30 and the pixel cells 10 is an interlayer dielectric (ILD) region 3. The ILD region 3 typically includes multiple layers of interlayer dielectrics and conductors that form connections between devices of the pixel cells 10 and from the pixel cells 10 to circuitry 150 peripheral to the array 100. A dielectric layer 5 is typically provided between the color filter array 30 and microlenses 20.

One major disadvantage of the Bayer pattern color filter, and of other color filter patterns that use alternating RGB filters over a single array, is that crosstalk among the pixels can effectively reduce color reconstruction capabilities. Crosstalk can occur in two ways. Optical crosstalk occurs from several sources, on being when light enters the micro-lens at a wide angle and is not properly focused on the correct pixel. An example of angular optical crosstalk is shown in FIG. 1B. Most of the filtered red light 15 reaches the correct photo-conversion device 12r, but some of the filtered red light 16 intended for red photo-conversion device 12r is misdirected to adjacent green and blue pixels.

Electrical crosstalk can also occur in the array through a blooming effect. Blooming occurs when the intensity of a light source is so intense that the charge collecting well 13r, 13g of the pixel cell 10 cannot store any more electrons and provides extra electrons 17 into the substrate and adjacent charge collecting wells. Where a particular color, e.g., red, is particularly intense, this blooming effect can artificially increase the response of adjacent green and blue pixels.

It would, therefore, be advantageous to have alternative color filter arrangements for use in an image sensor to provide more accurate color data and which mitigates against optical and electrical crosstalk.

BRIEF SUMMARY OF THE INVENTION

The invention, in various exemplary embodiments, incorporates multiple image sensor arrays, having separate respective color filters, on the same imager die. One exemplary embodiment is an image sensor comprising a plurality of arrays of pixel cells at a surface of a substrate, wherein each pixel cell comprises a photo-conversion device. Each array is configured to capture the same image by an optical system which provides the same image to each array. An image processor circuit is connected to the plurality of arrays and configured to combine images captured by the respective arrays, and produce an output image.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

Figure 1A:
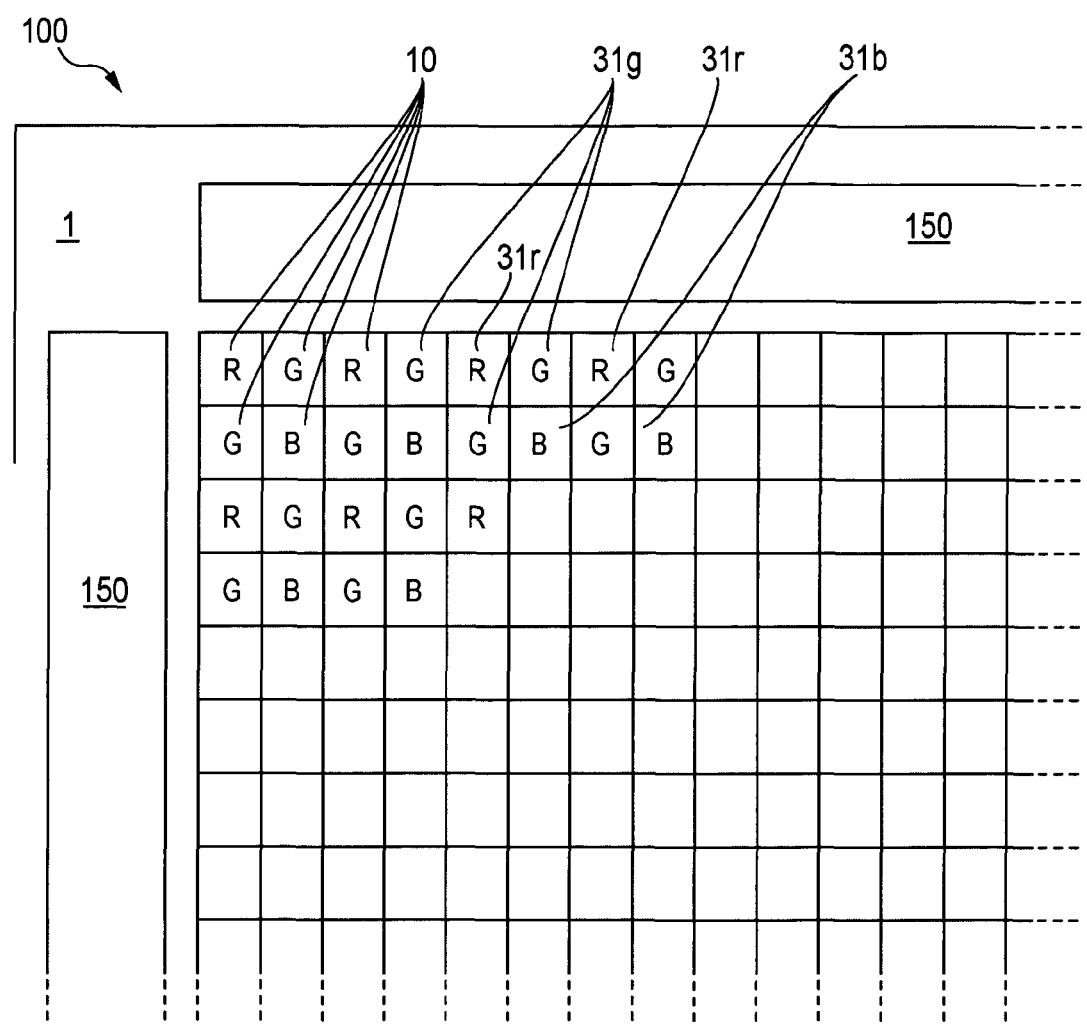
FIG. 1A is a top plan view of a portion of a conventional Bayer pattern color image sensor.
Figure 1B:
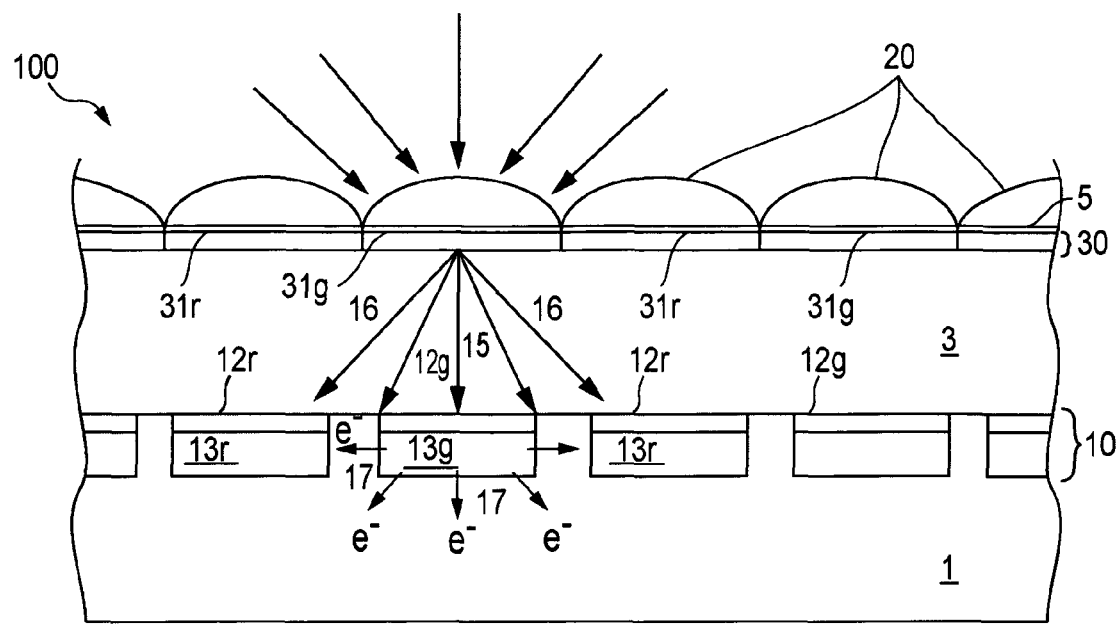
FIG. 1B is a cross sectional view of a portion of a conventional color image sensor.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" or "pixel cell" refers to a picture element unit cell containing a photo-conversion device for converting electromagnetic radiation to an electrical signal. Typically, the fabrication of all pixel cells in an image sensor will proceed concurrently in a similar fashion.

Figure 2:
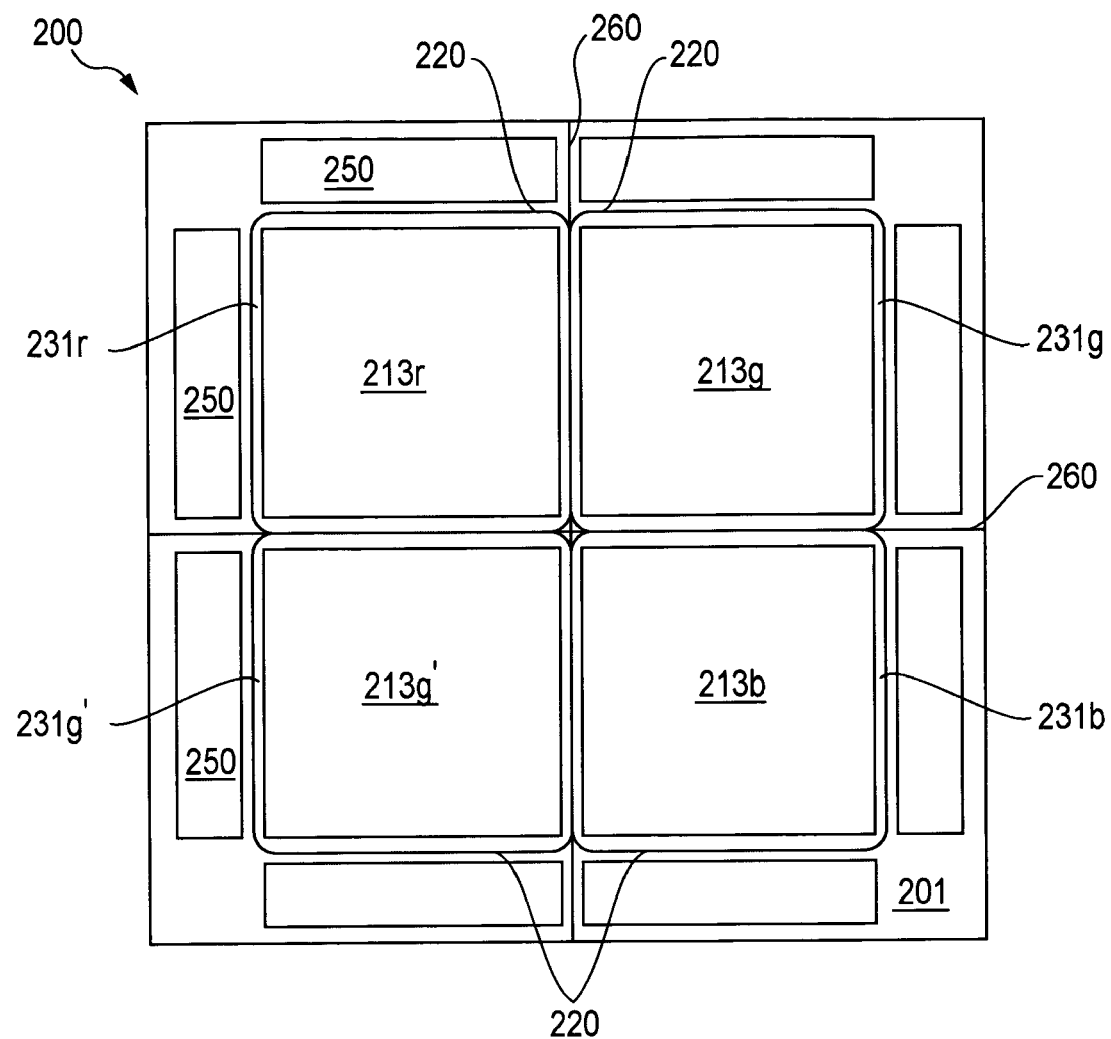
FIG. 2 is a top plan view of a 2×2 array image sensor according to an embodiment of the present invention.

FIG. 2 is a top plan view of a multi-array image sensor 200 according to an embodiment of the present invention. In the illustrated embodiment, image sensor 200 is a 2×2 array sensor. Image sensor 200 includes a substrate 201 on which four pixel arrays 213r, 213b, 213g, 213g' and associated support circuitry 250 for each array 213r, 213b, 213g, 213g' are fabricated. The illustrated embodiment contains two green pixel arrays 213g, 213g', one red pixel array 213r' and one blue pixel array 213b. Opaque walls 260 separate the individual arrays. Four imaging filters 231r, 231b, 231g, 231g' are respectively arranged above the pixel arrays 213r, 213b, 213g, 213g' in a Bayer pattern. Red filter 231r is arranged above red pixel array 213r, blue filter 231b is arranged above blue pixel array 213b and green filters 231g, 231g' are arranged above respective green pixel arrays 213g, 213g'. Four imaging lenses 220 are arranged above the imaging filters 231r, 231b, 231g, 231g'.

Including a multi-array color image sensor on a single die allows the reduction of color crosstalk artifacts, especially for compact camera modules with pixel sizes less than 6 microns by 6 microns. Multiple imaging arrays 213r, 213b, 213g, 213g' arranged on a single die and containing separate color filters 231r, 231b, 231g, 231g' achieves superior color performance while reducing the focal length of the imaging lens system. This arrangement can significantly reduce color crosstalk; moreover, an imaging lens with a shorter focal length can minimize parallax effects and allow a camera module employing image sensor 200 to be more compact.

The multi-array layout has several advantages over conventional systems. In addition to providing a lens with a shorter focal length, the color filters can be more easily embedded in the imaging lens itself rather than requiring individual color filters for each pixel, providing better flexibility to tune and optimize the color filters for better color image reconstruction and maximum photon throughput. As discussed above, color crosstalk can be significantly reduced because the different color filter arrays are completely isolated.

In addition, color aliasing will be reduced and demosaicing will be unnecessary, as compared to an array using a Bayer pattern filter, because of the single pixel accuracy of each color filtered array. Using separate color arrays also allows more flexibility in areas such as exposure time control and separate pixel parameter optimization such as, e.g., spectral response, conversion gain, etc.

Shorter focal length lenses may be used because the image area per lens can be 25% of the area of the a typical Bayer pattern sensor array. This shorter focal length translates to an extended depth of field of the imaging module and may alleviate the need for an auto-focus mechanism.

In the above embodiments, once each array has captured an image, the image is assigned a color according to the color of the filter above the array. These images can now be combined to form a single RGB color output in which each pixel of the output uses pixel values from a corresponding pixel from each of the arrays.

The RGB color output may exhibit some degree of parallax error in at least one linear direction because the arrays are attempting to capture the same image from different positions on the same plane. In general, the shorter focal length eliminates a large portion of the parallax inherent to using separate color arrays on the same die. For situations where parallax error is large enough to interfere with the proper reconstruction of an image, e.g., where an object to be captured is very close to the imager lens, post processing of the captured image (discussed in detail below) may be performed.

Figure 3:
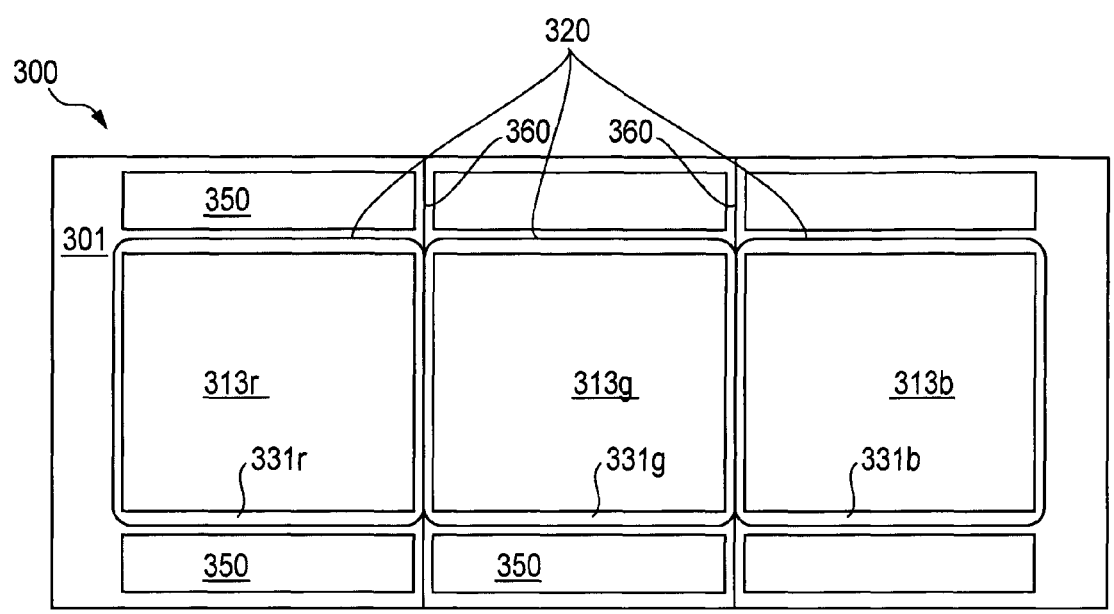
FIG. 3 is a top plan view of a 3×1 array image sensor according to another embodiment of the present invention.

FIG. 3 is a top plan view of another multi-array image sensor 300 according to another embodiment of the present invention. In the illustrated embodiment, image sensor 300 is a 3×1 array sensor. Image sensor 300 includes a substrate 301 which houses three pixel arrays 313r, 313b, 313g and associated support circuitry 350 for each array. This embodiment contains one green pixel array 313g, one red pixel array 313r and one blue pixel array 313b. Opaque walls 360 separate the individual arrays. Three imaging filters 331r, 331b, 331g, are arranged above each pixel array 313r, 313b, 313g. Red filter 331r is arranged above pixel array 313r, blue filter 331b is arranged above pixel array 313b and green filter 331g is arranged above pixel array 313g. Three imaging lenses 320 are arranged above the respective imaging filters 331r, 331b, 331g.

As set forth above, once each array has captured an image, the image is assigned a color according to the color of the filter above the array. These images can now be combined to form a single RGB color output.

A 3×1 array image sensor has the additional advantage of confining any parallax errors to one linear direction. By arranging the arrays such that parallax only occurs in one linear direction, the amount and type of post-processing necessary to reconstruct the image from the captured image data may be reduced.

Figure 4:
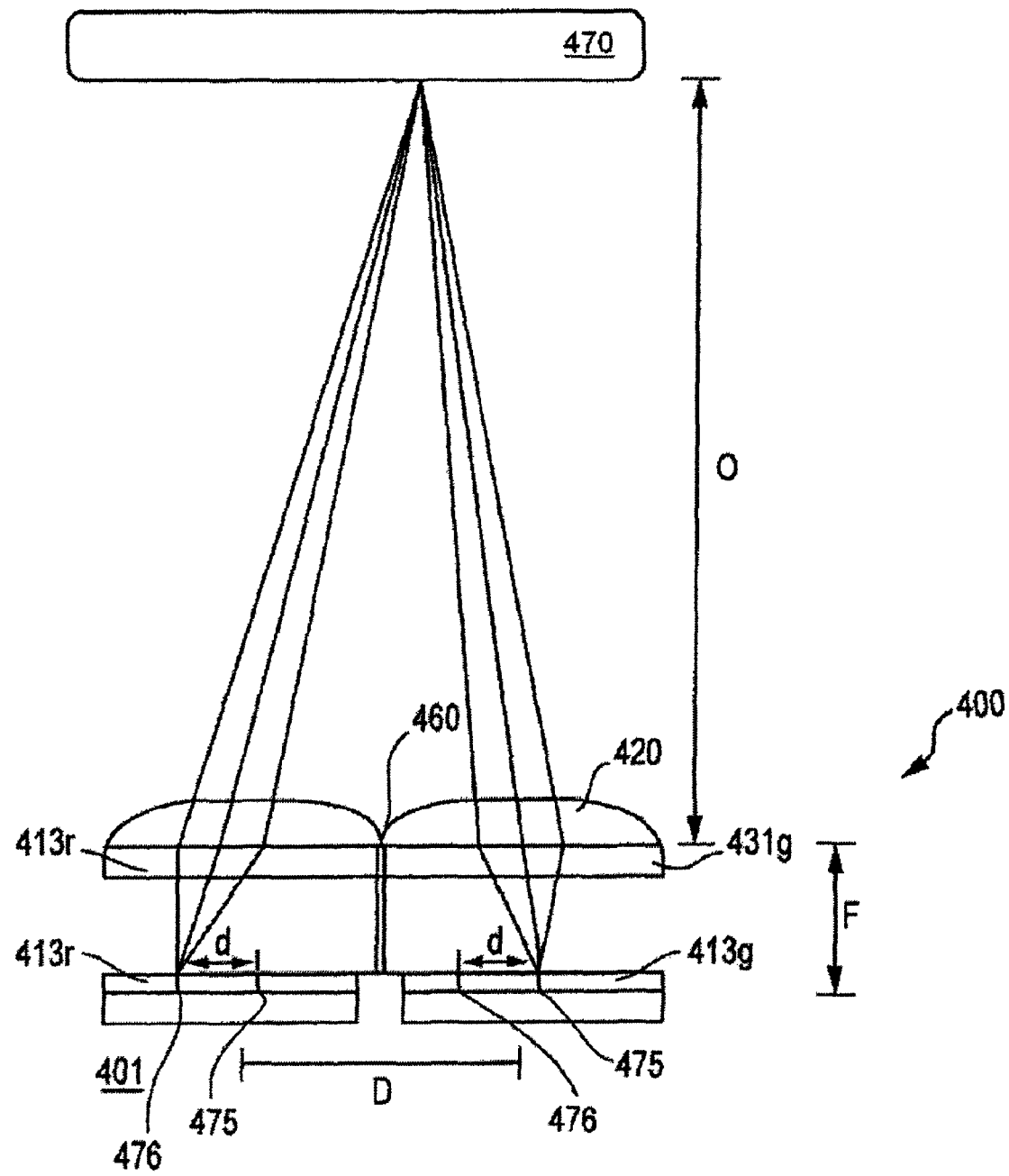
FIG. 4 is a cross sectional view of a portion of the array according to an embodiment of the present invention.

FIG. 4 is a cross sectional view of a portion of an image sensor 400 according to any embodiment of the present invention (e.g., according to the 2×2 or 3×1 pixel arrays shown in FIGS. 2 and 3). Sensor 400 includes a substrate 401 on which a plurality of pixel arrays 413r, 413g and associated support circuitry (not shown) for each array are fabricated. The illustrated portion shows one green pixel array 413g and one red pixel array 413r. It should be appreciated that there is at least one blue array and possibly another green array that are not shown in the cross sectional view. Opaque walls 460 separate the individual arrays and imaging lenses 431r, 431g that are arranged above each respective pixel array 413r, 413g.

As an object to be imaged 470 moves closer to the imaging lenses 420, the individual arrays 413r, 413g will exhibit an increase in parallax shift between them. The magnitude of the parallax shift between two arrays is approximated by the following formula:

$$n \cdot w = d = \frac{F \cdot D}{O} \qquad (1)$$

where d is the parallax shift distance on the image pixel array, F is the focal length of the lens, D is the center-to-center distance between the two arrays, and O is the distance between the object to be imaged 470 and the imaging lens 420. Further, w is the center-to-center distance between two pixels and n is the number of pixels to be shifted based on the parallax calculation.

According to formula 1, a decrease in focal length F and/or a decrease in center-to-center distance between the arrays D will result in a decrease in overall parallax shift for a given object distance O. The object distance O can be manually set, or can be detected by a conventional distance detection device, e.g. an infrared sensor or autofocus mechanism (not shown). Once the object distance O has been measured or approximated, the parallax shift calculation can be performed.

In the example shown in FIG. 4, a portion of object 470 is captured by pixel 475 on sensor array 413*g*, but by pixel 476 on sensor array 413*r* instead of corresponding pixel 475. By selecting one array, e.g., 413*g*, as a reference array, the parallax shift d is calculated from the object distance O, focal length F and center-to-center distance D. The required number of pixels n to shift the output image of 413*r* can then be calculated by dividing the parallax shift d by the center-to-center between pixels w. In this example, when providing an RGB output, the output of pixel 475 for the green array will be used with the output of pixel 476 of the red array. Of course, the RGB output will also include a corresponding pixel from a second green array and the blue array as well, shifted as necessary to correct for parallax shift.

Figure 5A:
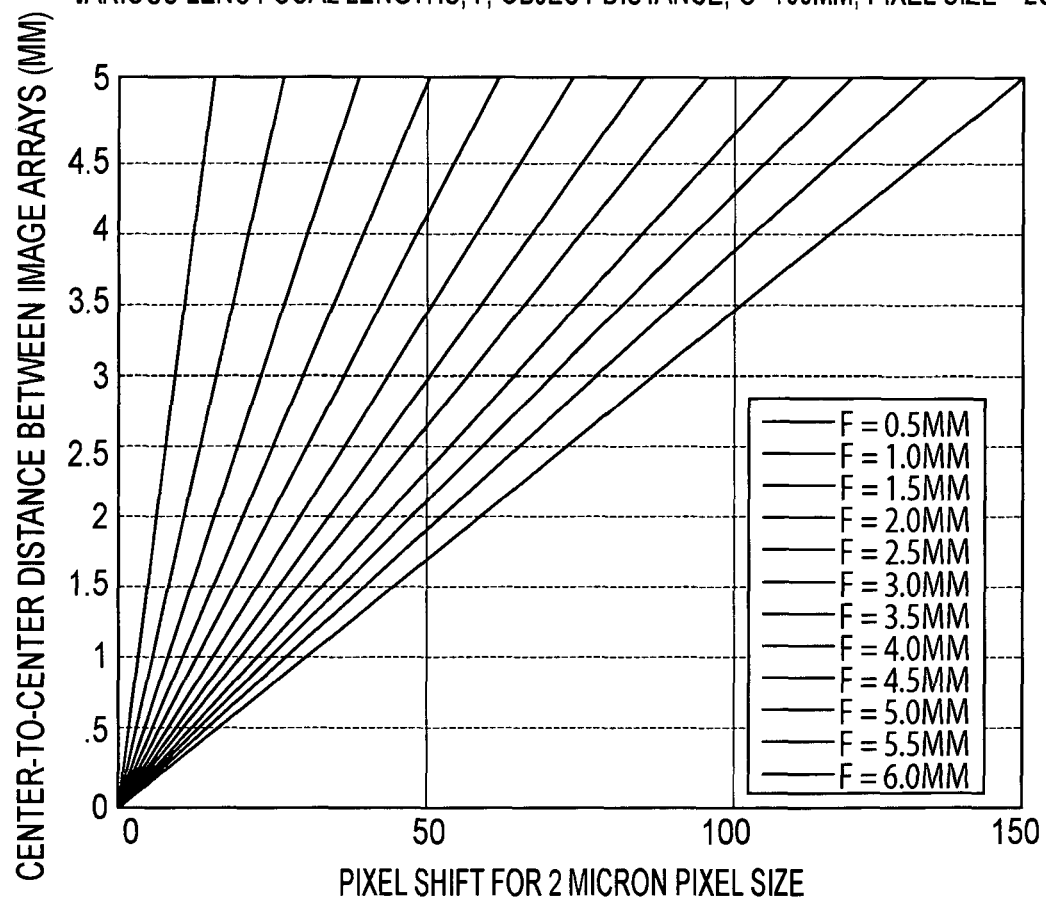
FIG. 5A is a graph showing the relationship between parallax shift and the center-to-center distance between arrays according to an embodiment of the present invention.
Figure 5B:
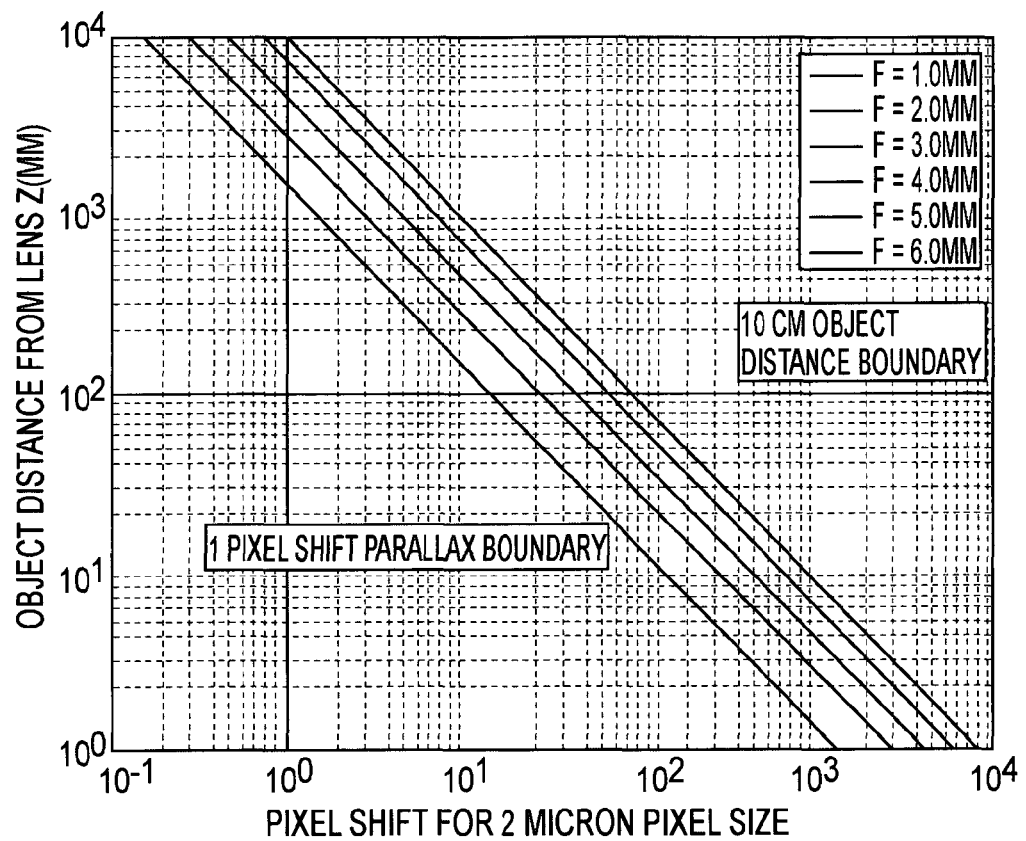
FIG. 5B is a graph showing the relationship between parallax shift and the distance of an object from the lenses of the array according to an embodiment of the present invention.

FIG. 5A, for example, is a graph showing the relationship between parallax shift d and the center-to-center distance D between arrays based on a pixel size of 2 microns and an object distance O of 100 mm. FIG. 5B is another graph, which shows the relationship between parallax shift d and the distance of an object O from the lenses of the array, based on a pixel size of 2 microns and a center-to-center distance D of 3 mm.

As object distance O increases, parallax shift d becomes negligible. For example, for the design example shown in FIG. 5B, with a pixel size of 2 microns and a center-to-center distance D of 3 mm, parallax shift d becomes negligible at object distances O greater than 1 m.

Where an image contains objects having different object distances O, especially when these distances O are both small and large, the image may be corrected for one object or the other, depending on user preferences and processing settings. Again, as focal length F and center-to-center distance D decrease, the parallax shift d will be less pronounced even for objects having small object distances O, allowing for fewer tradeoffs when capturing images having both near and far objects.

Figure 6:
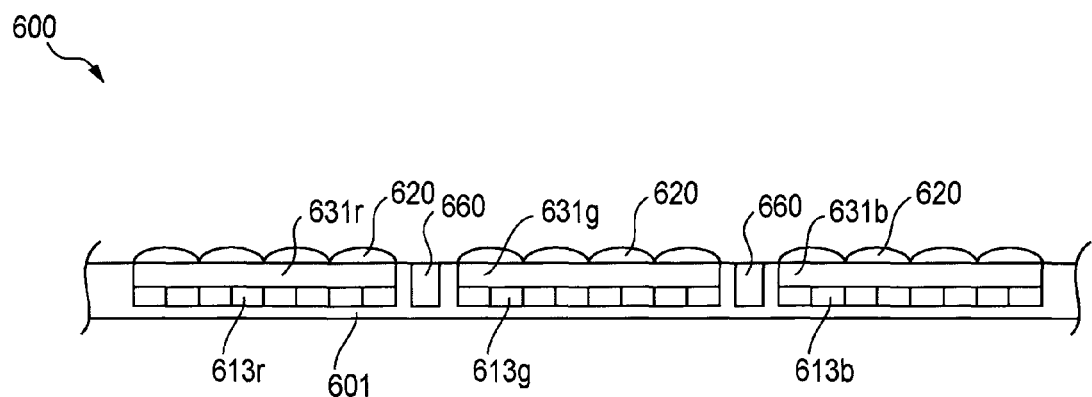
FIG. 6 is a cross sectional view of a portion of the array according to another embodiment of the present invention.

FIG. 6 is a cross sectional view of a portion of the array according to another embodiment of the present invention (e.g., according to the 2×2 or 3×1 pixel arrays shown in FIGS. 2 and 3). Sensor 600 includes a substrate 601 on which a plurality of pixel arrays 613*r*, 613*g*, 613*b* and associated support circuitry (not shown) for each array are fabricated. The illustrated portion shows one red pixel array 613*r*, one green pixel array 613*g* and one blue pixel array 613*b*, each having a respective color filter 631*r*, 631*g*, 631*b*. For simplicity, the embodiment shown in FIG. 6 shows pixel arrays 613*r*, 613*g*, 613*b* that are eight pixels wide, but it should be appreciated that the pixel arrays 613*r*, 613*g*, 613*b* may contain as many or as few pixels as desired. It should also be appreciated that there may be additional arrays that are not shown in the cross sectional view. Opaque walls 660 separate the individual arrays and arrays of imaging lenses 620 that are arranged above each respective pixel array 613*r*, 613*g*, 613*b*.

In this embodiment, rather than fabricating a single lens over each array 613*r*, 613*g*, 613*b* (as in the embodiments shown in FIGS. 2-4), respective arrays of microlenses 620 are fabricated over one or more pixels in each array 613*r*, 613*g*, 613*b*. The individual lenses may cover and focus light on any number of pixels; in the specific embodiment shown in FIG. 6A, each mircolens in each array 620 covers and focuses light on a four pixel section (in a 2×2 pattern) of the pixels arrays 613*r*, 613*g*, 613*b*.

Figure 7:
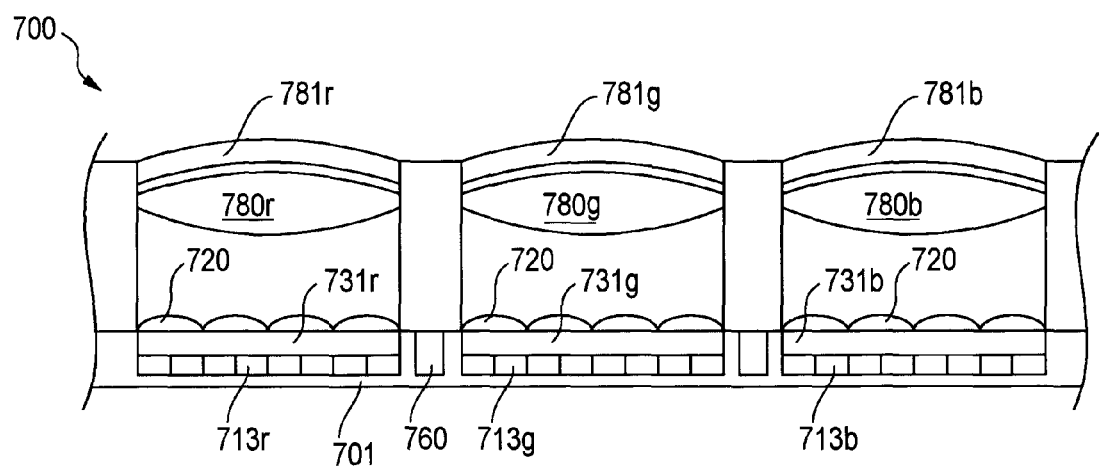
FIG. 7 is a cross sectional view of a portion of the array according to another embodiment of the present invention.

FIG. 7 is a cross sectional view of a portion of the array according to another embodiment of the present invention (e.g., according to the 2×2 or 3×1 pixel arrays shown in FIGS. 2 and 3). Sensor 700 includes a substrate 701 on which a plurality of pixel arrays 713*r*, 713*g*, 713*b* and associated support circuitry (not shown) for each array are fabricated. The illustrated portion shows one red pixel array 713*r*, one green pixel array 713*g* and one blue pixel array 713*b*, each having a respective color filter 731*r*, 731*g*, 731*b*. For simplicity, the embodiment shown in FIG. 7 shows pixel arrays 713*r*, 713*g*, 713*b* that are eight pixels wide, but it should be appreciated that the pixel arrays 713*r*, 713*g*, 713*b* may contain as many or as few pixels as desired. It should also be appreciated that there may be additional arrays that are not shown in the cross sectional view. Opaque walls 760 separate the individual arrays and arrays of imaging lenses 720 that are arranged above each respective pixel array 713*r*, 713*g*, 713*b*. The embodiment shown in FIG. 7 additionally contains lens elements 780*r*, 781*r*, 780*g*, 781*g*, 780*b*, 781*b*.

Lens elements 780*r*, 781*r*, 780*g*, 781*g*, 780*b*, 781*b* are optimized to produce the best focal spot resolution and aberration free performance for the wavelength range of each color filter 731*r*, 731*g*, 731*b*. For example, since pixel array 713*r* is associated with a single red color filter 731*r*, the set of lenses 780*r*, 781*r* can be optimized for the red wavelength range rather than the entire range of visible light. Individual color arrays can also be optimized for varying the dopant implants and epixatial (EPI) layer thickness among different arrays 713*r*, 713*g*, 713*b*. For example, by fabricating the EPI layer (not shown) within blue pixel array 713*b* to have a thickness small enough to only respond to blue light wavelengths, blue color filter 731*b* may be omitted.

Figure 8A:
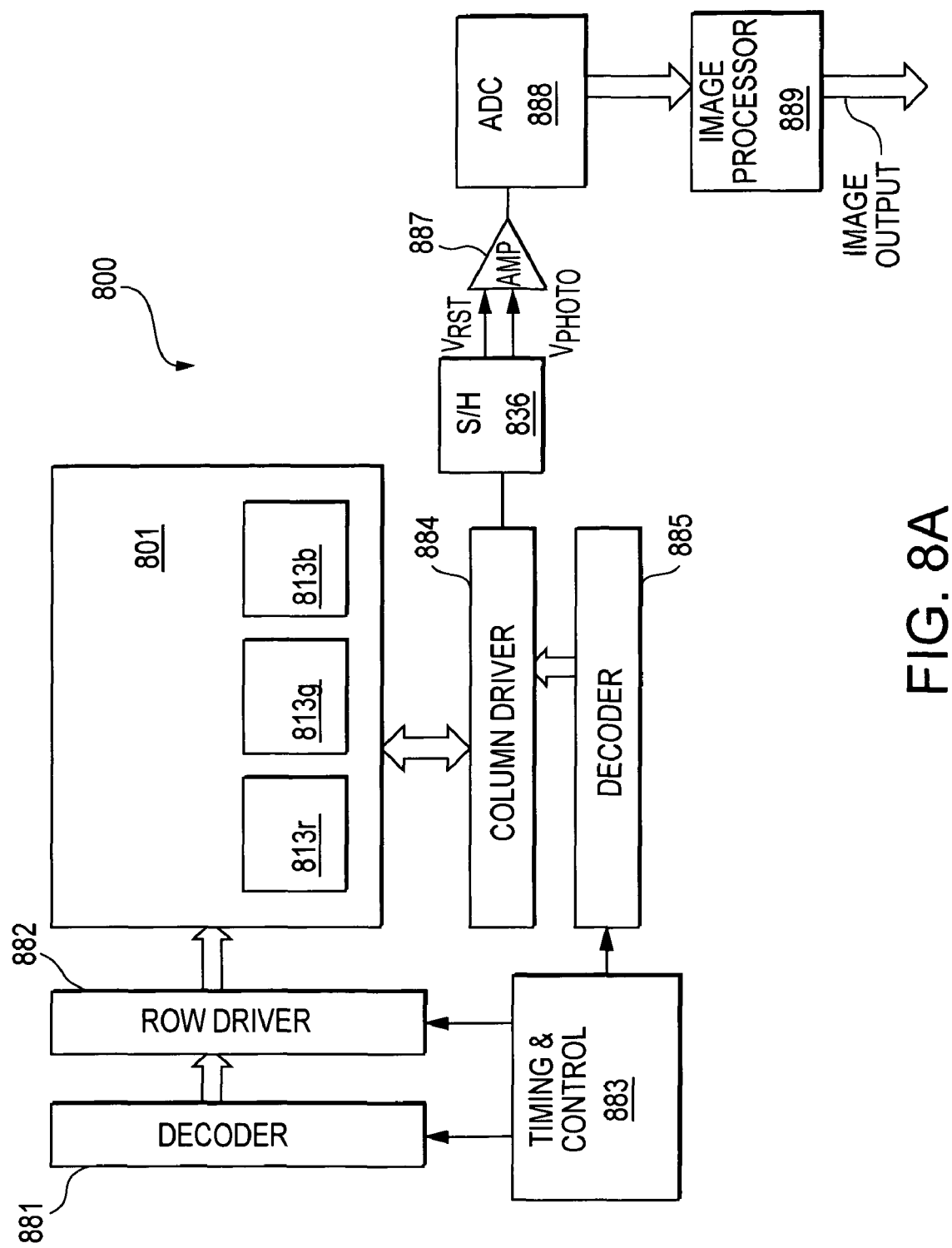
FIG. 8A is a top plan view of an imager employing a pixel array according to an embodiment of the present invention.

A more detailed single chip CMOS image sensor 800 is illustrated by the block diagram of FIG. 8A. The image sensor 800 includes a pixel cell array 801 according to an embodiment of the invention. The array 801 comprises a red array 813*r*, a green array 813*g* and a blue array 813*b*, similar to the embodiment shown in FIG. 3. The array 801 can also comprise one or more arrays of the embodiment shown in FIG. 2, or any other similar arrangement using multiple color arrays.

The rows of pixel cells in array 801 are read out one by one. Accordingly, pixel cells in a row of array 801 are all selected for readout at the same time by a row select line, and each pixel cell in a selected row provides a signal representative of received light to a readout line for its column. In the array 801, each column also has a select line, and the pixel cells of each column are selectively read out in response to the column select lines.

The row lines in the array 801 are selectively activated by a row driver 882 in response to row address decoder 881. The column select lines are selectively activated by a column driver 884 in response to column address decoder 885. The array 801 is operated by the timing and control circuit 883, which controls address decoders 881, 885 for selecting the appropriate row and column lines for pixel signal readout.

The signals on the column readout lines typically include a pixel reset signal ($V_{rst}$) and a pixel image signal ($V_{sig}$) for each pixel cell. Both signals are read into a sample and hold circuit (S/H) 886 in response to the column driver 884. A differential signal ($V_{rst}-V_{sig}$) is produced by differential amplifier (AMP) 887 for each pixel cell, and each pixel cell's differential signal is amplified and digitized by analog-to-digital converter (ADC) 888. The analog-to-digital converter 888 supplies the digitized pixel signals to an image processor 889, which performs appropriate image processing, which can include combining the outputs of multiple arrays and performing the parallax adjustment calculation described above, before providing digital signals defining an image output.

Figure 8B:
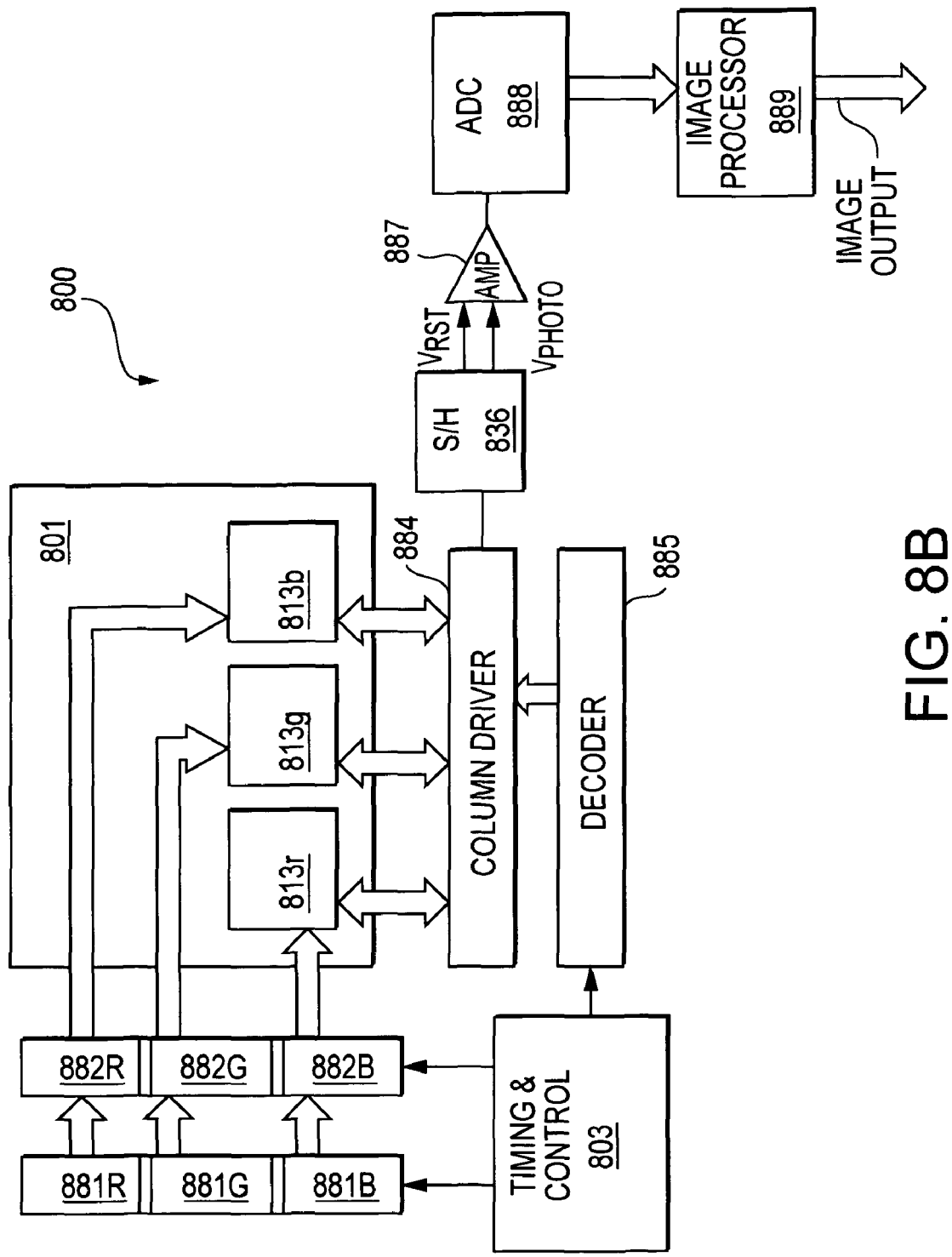
FIG. 8B is a top plan view of an imager employing a pixel array according to another embodiment of the present invention.

Another embodiment of a single chip CMOS image sensor 800' is illustrated by the block diagram of FIG. 8B. The image sensor 800' includes the same elements as image sensor 800 shown in FIG. 8A, and additionally includes individual row address decoders 881r, 881g, 881b and row drivers 882r, 882g, 882b for each array 813r, 813g, 813b, thereby allowing for individual control of red, green, and blue exposure times, and also allowing for white balancing responsive to variations in exposure times.

The row lines in the arrays 813r, 813g, 813b are each selectively activated by a respective row driver 882r, 882g, 882b in response to row address decoder 881r, 881g, 881b. The column select lines are selectively activated by a column driver 884 in response to column address decoder 885. The array 801 is operated by the timing and control circuit 883, which controls address decoders 881r, 881g, 881b, 885 for selecting the appropriate row and column lines for pixel signal readout.

Figure 9:
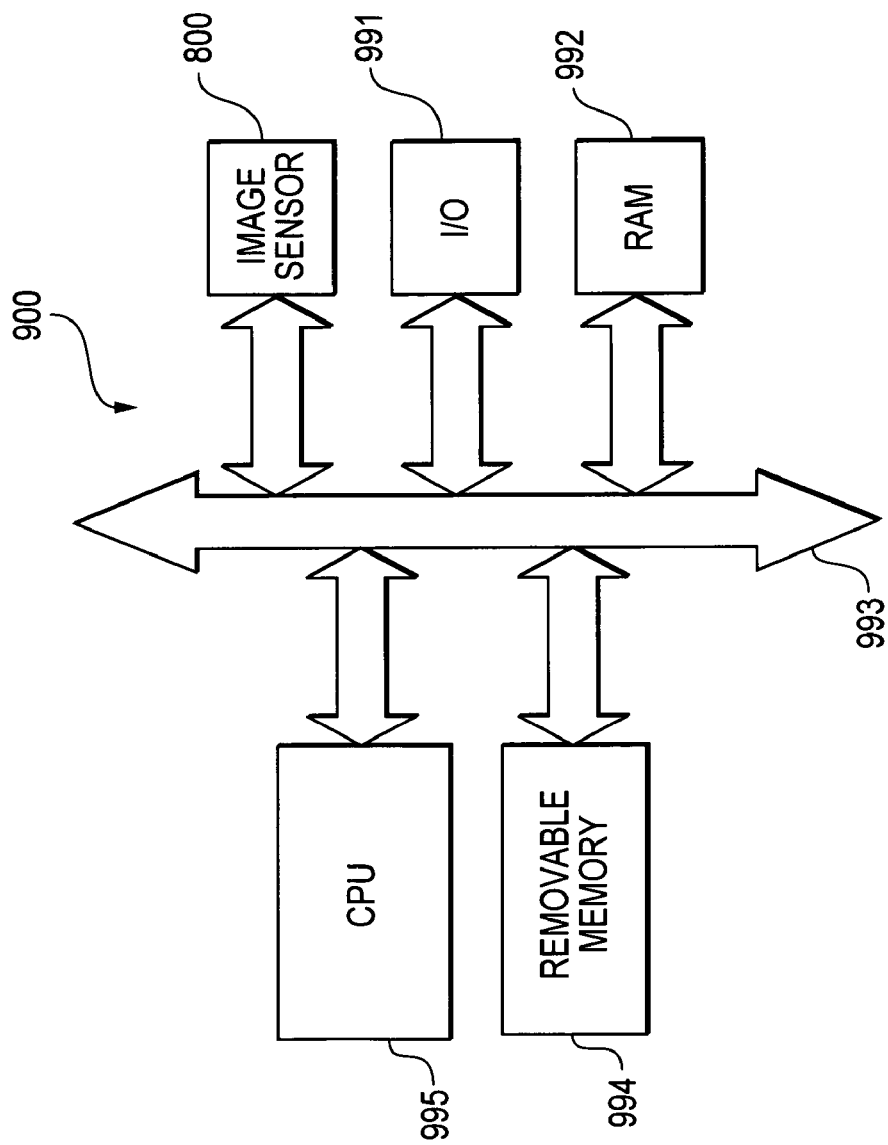
FIG. 9 is a top plan view of an image system employing an imager pixel array according to an embodiment of the present invention.

FIG. 9 illustrates a processor system 900 including the image sensor 800 of FIG. 8A. The processor system 900 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

The processor system 900, for example a camera system, generally comprises a central processing unit (CPU) 995, such as a microprocessor, that communicates with an input/output (I/O) device 991 over a bus 993. Image sensor 800 also communicates with the CPU 995 over bus 993. The processor-based system 900 also includes random access memory (RAM) 992, and can include removable memory 994, such as flash memory, which also communicate with CPU 995 over the bus 993. Image sensor 800 may be combined with a processor, such as a CPU, digital signal processor, or microprocessor, with or without memory storage on a single integrated circuit or on a different chip than the processor. The parallax adjustment calculation may be performed by the image sensor 800, or by the CPU 995.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims, including the use of other imager technologies such as CCD arrays, should be considered part of the present invention.

What is claimed as new and desired to be protected by Letters Patent of the United States is:

1. An image sensor comprising:
   a plurality of pixel cell arrays on a single substrate wherein each pixel cell array includes a plurality of pixel cells and is configured to capture a predetermined color of an image commonly applied to the plurality of pixel cells of each pixel cell array;
   a plurality of lenses arranged above said pixel cell arrays; and
   an image processor circuit configured to combine corresponding pixel outputs of said plurality of pixel cell arrays and produce a combined array color output image, wherein said image processor circuit is further configured to shift the outputs of at least one of said plurality of pixel cell arrays a specified number of pixels in at least one direction prior to producing a combined array color output image, wherein said image processor circuit is further configured store an object distance value and to calculate said specified number of pixels to shift the outputs of a respective pixel cell array according to the following formula:

$$n \cdot w = d = \frac{F \cdot D}{O}$$

where d represents a distance corresponding to the specified number of pixels, F represents the focal length of the lens arranged above the respective pixel cell array, D represents a center-to-center distance between two adjacent pixel cell arrays, O represents an object distance value, w represents a center-to-center distance between two adjacent pixels, and n represents the specified number of pixels.

2. The image sensor of claim 1, wherein said image processor is further configured to detect a distance between at least one object in said image and said image sensor and to set said distance as said object distance value.

3. An imaging system comprising:
   a processor, and
   an image sensor coupled to the processor, said sensor comprising:
      a plurality of pixel cell arrays on a single substrate wherein each pixel cell array includes a plurality of pixel cells and is configured to capture a predetermined color of an image commonly applied to the plurality of pixel cells of each pixel cell array;
      a plurality of lenses arranged above said pixel cell arrays; and
      an image processor circuit configured to combine corresponding pixel outputs of said plurality of pixel cell arrays and produce a combined array color output image, wherein said image processor circuit is further configured to shift the outputs of at least one of said plurality of pixel cell arrays a specified number of pixels in at least one direction prior to producing a combined array color output image, wherein said image processor circuit is further configured store an object distance value and to calculate said specified number of pixels to shift the outputs of a respective pixel cell array according to the following formula:

$$n \cdot w = d = \frac{F \cdot D}{O}$$

where d represents a distance corresponding to the specified number of pixels, F represents the focal length of the lens arranged above the respective pixel cell array, D represents a center-to-center distance between two adjacent pixel cell arrays, O represents an object distance value, w represents a center-to-center distance between two adjacent pixels, and n represents the specified number of pixels.

4. The imaging system of claim 3, wherein said image processor is further configured to detect a distance between at least one object in said image and said image sensor and to set said distance as said object distance value.

5. A method of capturing an image comprising the steps of:
capturing a predetermined color of an image on a plurality of pixel cell arrays arranged on a single substrate, said image being commonly applied to a plurality of pixel cells included in each pixel cell array, wherein the capturing step includes focusing light on the pixel cells of each pixel cell array using a lens arranged above said pixel cell array;
combining corresponding pixel outputs of said plurality of pixel cell arrays to produce a combined array color output image;
shifting the outputs of at least one of said plurality of pixel cell arrays a specified number of pixels in at least one direction prior to producing a combined array color output image; and
storing an object distance value and calculating said specified number of pixels to shift the outputs of a respective pixel cell array according to the following formula:

$$n \cdot w = d = \frac{F \cdot D}{O}$$

where d represents a distance corresponding to the specified number of pixels, F represents the focal length of the lens arranged above the respective pixel cell array, D represents a center-to-center distance between two adjacent pixel cell arrays, O represents an object distance value, w represents a center-to-center distance between two adjacent pixels, and n represents the specified number of pixels.

6. The method of claim 5, further comprising detecting a distance between at least one object in said image and said image sensor and to set said distance as said object distance value.

7. An image sensor comprising:
a plurality of pixel cell arrays on a single substrate wherein each pixel cell array includes a plurality of pixel cells and is configured to capture a predetermined color of an image commonly applied to the plurality of pixel cells of each pixel cell array;
a plurality of lenses arranged above said pixel cell arrays; and
an image processor circuit configured to combine corresponding pixel outputs of said plurality of pixel cell arrays and produce a combined array color output image, wherein said image processor circuit is further configured to shift the outputs of at least one of said plurality of pixel cell arrays a specified number of pixels in at least one direction prior to producing a combined array color output image, wherein said image processor circuit is further configured to determine said specified number of pixels to shift the outputs of a respective pixel cell array based on a focal length of the lens arranged above the respective pixel cell array, a distance between two pixel cell arrays and a distance between the image and the lens.

8. An imaging system comprising:
a processor, and
an image sensor coupled to the processor, said sensor comprising:
a plurality of pixel cell arrays on a single substrate wherein each pixel cell array includes a plurality of pixel cells and is configured to capture a predetermined color of an image commonly applied to the plurality of pixel cells of each pixel cell array;
a plurality of lenses arranged above said pixel cell arrays; and
an image processor circuit configured to combine corresponding pixel outputs of said plurality of pixel cell arrays and produce a combined array color output image, wherein said image processor circuit of said sensor is further configured to determine said specified number of pixels to shift the outputs of a respective pixel cell array based on a focal length of the lens arranged above the respective pixel cell array, a distance between two pixel cell arrays and a distance between the image and the lens.

9. A method of capturing an image comprising the steps of:
capturing a predetermined color of an image on a plurality of pixel cell arrays arranged on a single substrate, said image being commonly applied to a plurality of pixel cells included in each pixel cell array, wherein the capturing step includes focusing light on the pixel cells of each pixel cell array using a lens arranged above said pixel cell array;
combining corresponding pixel outputs of said plurality of pixel cell arrays to produce a combined array color output image;
shifting the outputs of at least one of said plurality of pixel cell arrays a specified number of pixels in at least one direction prior to producing a combined array color output image; and
determining said specified number of pixels to shift the outputs of a respective pixel cell array based on a focal length of the lens arranged above the respective pixel cell array, a distance between two pixel cell arrays and a distance between the image and the lens.

* * * * *